(12) United States Patent  
Isozaki et al.

(10) Patent No.: US 8,100,620 B2  
(45) Date of Patent: Jan. 24, 2012

(54) VACUUM PROCESSING APPARATUS

(75) Inventors: Masakazu Isozaki, Kudamatsu (JP); Akitaka Makino, Hikari (JP); Shingo Kimura, Shunan (JP); Minoru Yatomi, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 570 days.

(21) Appl. No.: 12/203,168

(22) Filed: Sep. 3, 2008

(65) Prior Publication Data

US 2009/0324367 A1  Dec. 31, 2009

(30) Foreign Application Priority Data

Jun. 27, 2008 (JP) .................................. 2008-168053

(51) Int. Cl.  
*H01L 21/677* (2006.01)

(52) U.S. Cl. ..................................................... 414/217

(58) Field of Classification Search .................. 414/217, 414/935  
See application file for complete search history.

(56) References Cited

U.S. PATENT DOCUMENTS

| 4,852,516 A * | 8/1989 | Rubin et al. .................. 118/715 |
| 6,312,525 B1 * | 11/2001 | Bright et al. .................. 118/719 |
| 7,025,554 B2 * | 4/2006 | Ozawa et al. ................. 414/217 |
| 7,032,614 B2 * | 4/2006 | Lappen et al. ................ 137/312 |
| 7,394,520 B2 * | 7/2008 | Klomp et al. .................... 355/30 |

FOREIGN PATENT DOCUMENTS

JP  2005-101598  4/2005

* cited by examiner

*Primary Examiner* — Scott Lowe  
(74) *Attorney, Agent, or Firm* — Antonelli, Terry, Stout & Kraus, LLP.

(57) ABSTRACT

A vacuum processing apparatus includes vacuum processing vessels each having a processing chamber with a pressure-reduced interior space, a vacuum transfer vessel which is coupled to the vacuum vessels disposed therearound and which has a low-pressure interior space in which a to-be-processed workpiece is conveyed, an atmospheric air transfer vessel which is coupled to the front side of the vacuum transfer vessel and which includes on its front face side cassette tables mounting thereon a cassette with the workpiece received therein for conveying the workpiece in an interior space under an atmospheric pressure, a position-aligning machine disposed within the atmospheric air transfer vessel at one of right and left ends for adjusting a position of the workpiece, and an adjuster disposed between lower part of this machine and a floor face for adjusting the supply of a fluid being fed to the vacuum processing vessels.

4 Claims, 6 Drawing Sheets

VACUUM PROCESSING APPARATUS

BACKGROUND OF THE INVENTION

The present invention relates generally to a vacuum processing apparatus, and more particularly to a semiconductor manufacturing apparatus having a plurality of processing chambers for processing a substrate-like substrate-like workpiece, such as a semiconductor wafer, in an interior space with its pressure being reduced.

In the apparatus of the type stated above, especially the vacuum processing apparatus for processing a substrate-shaped workpiece under manufacture, such as a wafer or else, in a pressure-reduced interior space of the apparatus, it has been required to improve the efficiency of substrate processing operation while at the same time achieving miniaturization and higher accuracy of the processing. To do this, the so-called multi-chamber apparatus has been developed in recent years, which comprises a plurality of processing chambers with a plurality of vacuum vessels or containers being coupled together in one apparatus. In this processing apparatus having a plurality of processing rooms or chambers, each processing chamber is coupled to a conveyance room (transfer chamber), which is designed to have a robot arm or the like for transportation of a substrate(s) while an inner gas and its pressure are adjusted in a pressure-reducible way.

In this apparatus, the number of those workpieces to be processed by one vacuum processing apparatus per unit time increases; thus, it is possible to improve the productivity per installation area of a user's building, such as a clean room with a plurality of vacuum processing apparatuses installed therein. Typically, such apparatuses are arrayed along a line-shaped passage in the cleanroom at an edge of passage, along which workpiece-containing vessels, such as cassettes, are transferred by a robot or the like. As the apparatuses aligned along one passage increase in number, the number of processable workpieces per facility is considered to increase, resulting in an increase in process efficiency.

Accordingly, in the vacuum processing apparatus to be installed within such facility building, the apparatus in the installed state is demanded to lessen a floor area of the building. Furthermore, since this apparatus is needed to undergo maintenance periodically, a need is felt to provide a space for the maintenance also. This maintenance space is typically reserved around the apparatus main body and is arranged to have a predetermined width on the floor on which the apparatus is installed in such a manner as to permit the user or a maintenance worker(s) to walk while having maintenance parts and tools.

One example of such multi-chamber construction has been disclosed in JP-A-2005-101598.

SUMMARY OF THE INVENTION

The related art stated above is faced with problems because it lacks considerations about the following points.

More specifically, each part of those units making up a vacuum processing apparatus e.g., atmospheric air-side blocks which convey a wafer(s) under ambient pressures or processing units including vacuum vessels constituting a wafer processing room is not laid out efficiently with waste spaces being left; so, the processing unit's installation area and volume increase, resulting in an unwanted increase in occupation area of an entirety of the apparatus. For this reason, an installable apparatus number at vacuum processing apparatus installation locations decreases in some cases, and a space around a vacuum processing apparatus usable by the user for maintenance and walk-around purposes became smaller in other cases.

In the above-noted related art, a plurality of processing units each of which internally has a processing chamber are laid out around a vacuum transfer chamber so that these units are coupled to the side face of the vacuum transfer chamber having its interior space evacuated to a vacuum. These processing units are designed to be separated from the vacuum vessel that contains therein a vacuum transfer chamber and shut off between any two of them to be set in a state that one is electrically and spatially cut in coupling out of the main body of vacuum processing apparatus to thereby enable execution of maintenance works, such as maintenance and parts replacement. In addition, the size of each processing unit is significantly influenceable by the diameter of a wafer to be processed, the structure of a vacuum vessel making up the processing unit, a power supply and control device needed for operation of units as built in the processing unit, and the size and layout of a utility, such as gas/water regulators or else. Accordingly, the occupation area at the time of installation of the entire apparatus must vary depending upon size dimensions of either the processing room or the chamber. In the related art, the supply of a cooling medium necessary for each processing unit was performed from either a connection unit which is provided within each processing unit or a connector unit that is provided on a floor face near or around each processing unit. This approach was faced with problems which follow: an increase in size of each processing unit, a decrease in maintenance space, and an increase in apparatus installation area.

Another problem is that installation and maintenance works are undesirably increased in complexities because the coolant-supplying connector unit is provided at each processing unit.

As stated above, in the related art, the wafer processing efficiency per installation area of vacuum processing apparatus has been diminished and deteriorated.

It is therefore an object of this invention to provide a semiconductor manufacturing apparatus which makes effective use of dead spaces to thereby increase the productivity per installation area. Another object of the invention is to provide a vacuum plasma processing apparatus capable of reducing complexities of installation and maintenance works and lowering manufacturing costs.

To attain the foregoing objects, in accordance with one aspect of this invention, a vacuum processing apparatus is provided which includes a plurality of vacuum processing vessels or containers each having a processing chamber with its interior space being reduced in pressure, a vacuum transfer vessel or container which is coupled to the vacuum processing vessels disposed therearound and which has a pressure-reduced interior space in which a workpiece to be processed is conveyed, an atmospheric air transfer vessel which is coupled to the front side of the vacuum transfer vessel and which includes on its front face side a plurality of cassette tables mounting thereon a cassette with the workpiece being received therein for causing the workpiece to be conveyed in an interior space under application of an atmospheric pressure, a position aligning machine which is disposed within the atmospheric air transfer vessel at one end of right and left ends for adjusting a position of the workpiece, and an adjuster disposed between a lower part of the position aligning machine and a floor face for adjusting supply of a fluid as fed to the vacuum processing vessels.

Currently preferably, in the apparatus, the fluid is a cooling liquid of any one of the vacuum processing vessels and workpiece tables as internally provided therein. The transfer vessel may be designed to have a polygonal planar shape when viewing from above it with the vacuum processing vessels being coupled to a plurality of sides thereof, wherein the atmospheric air transfer vessel is disposed to be offset toward the one end side of the vacuum transfer vessel, and the position aligning machine and its underlying adjuster are placed at an end portion on the one end side. Also preferably, the vacuum processing apparatus further includes a workpiece conveying robot which is disposed in an inner space of the atmospheric air transfer vessel and which is driven to move along layout of the cassette tables on the front side thereof.

Other objects, features and advantages of the invention will become apparent from the following description of the embodiments of the invention taken in conjunction with the accompanying drawings.

DETAILED DESCRIPTION OF THE EMBODIMENT

Figure 1A:
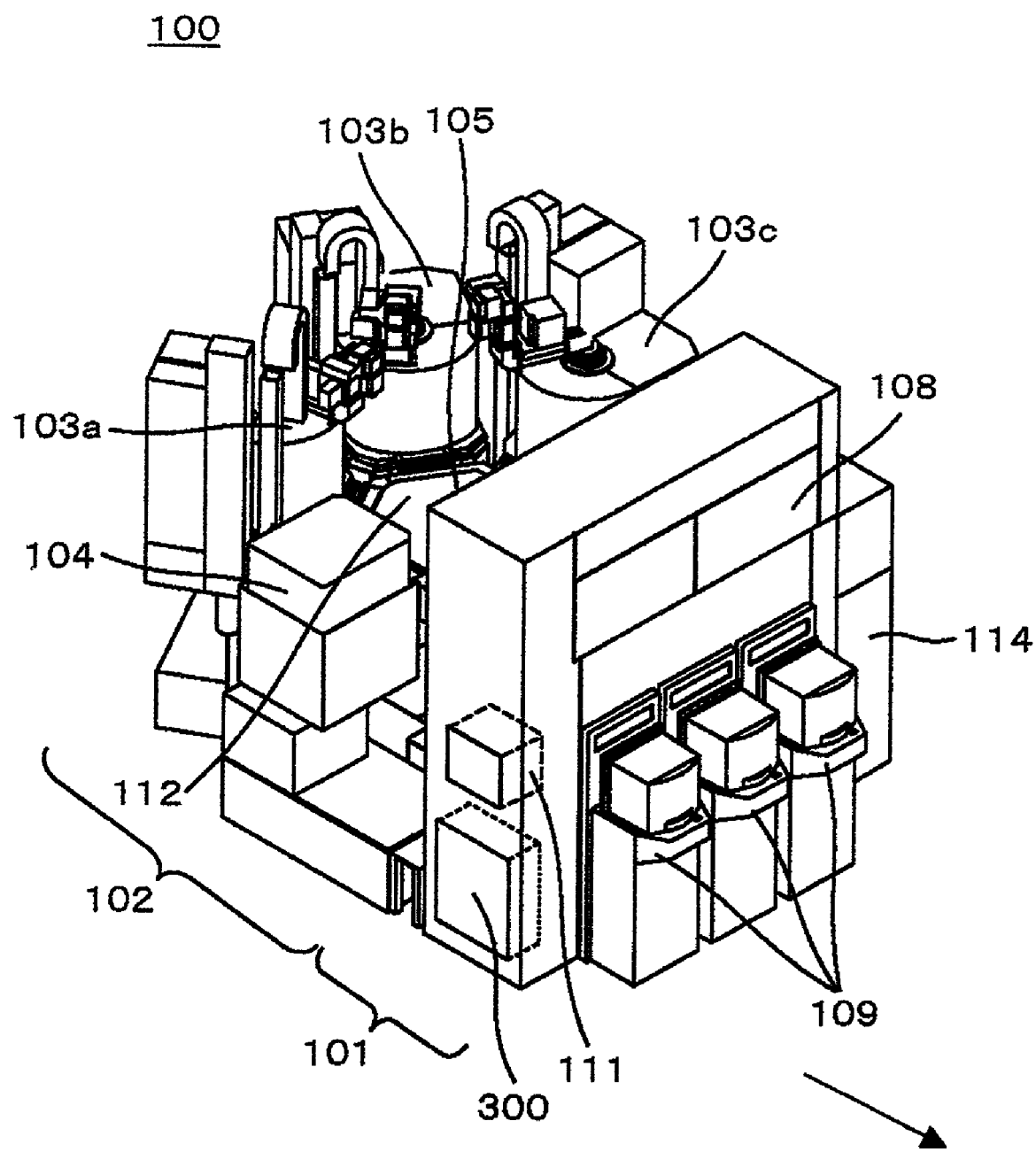
FIG. 1A is a diagram showing a front perspective view of an entire structure of a vacuum processing apparatus in accordance with one embodiment of this invention; and, FIG. 1B is a rear perspective of the vacuum processing apparatus.

Currently preferred embodiments of the present invention will be described with reference to the accompanying figures of the drawing below.

Embodiment 1

Figure 1B:
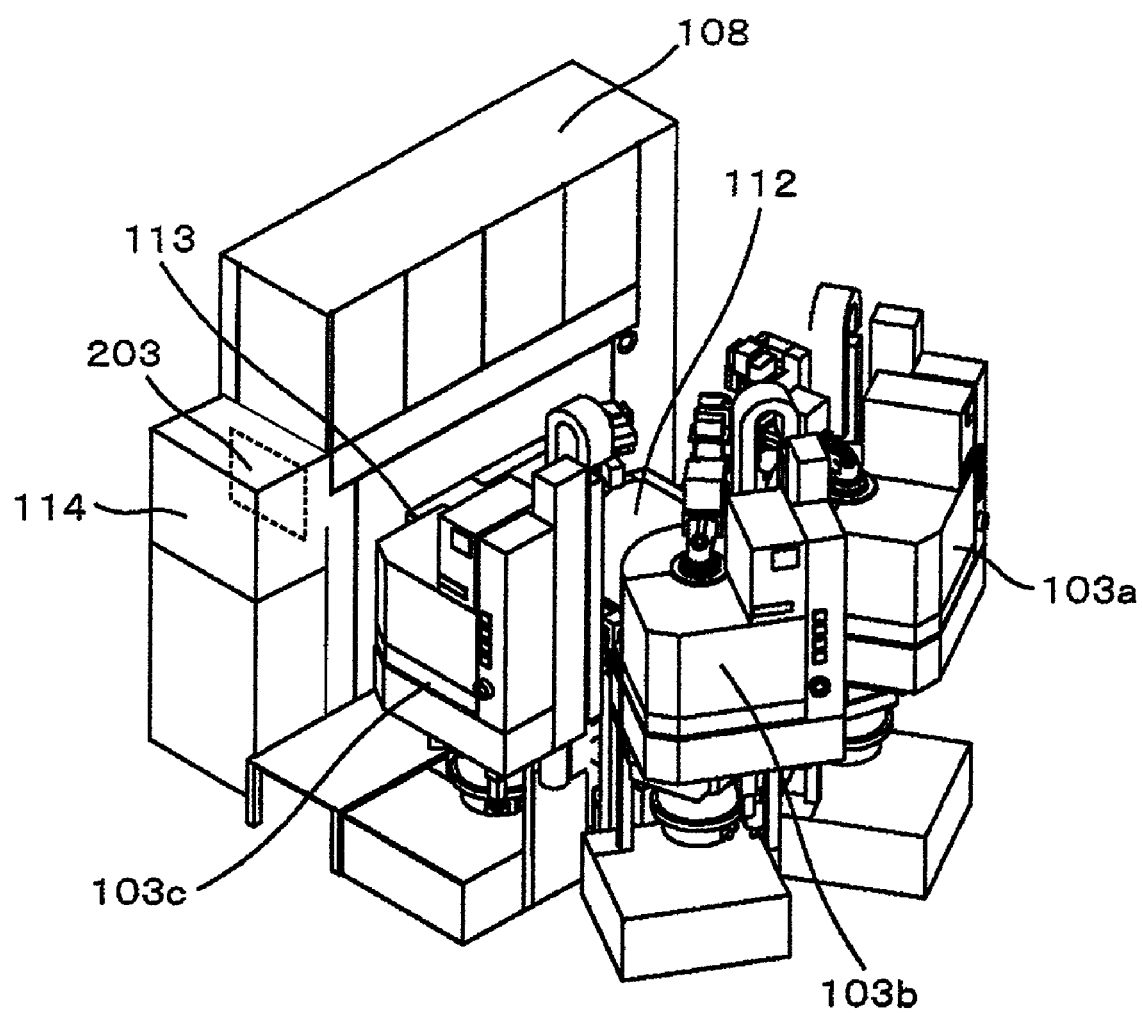

An embodiment of this invention will be explained using FIGS. 1A to 3B. FIGS. 1A and 1B are perspective views of an overall structure of a vacuum processing apparatus in accordance with this embodiment of the invention, wherein FIG. 1A is a front perspective view whereas FIG. 1B is a rear perspective view.

As shown herein, the vacuum processing apparatus 100 is generally made up of two, front and back blocks. The front side of the vacuum processing apparatus 100 is an atmosphere-side block 101, in which a wafer that was supplied to this apparatus is conveyed to a pressure-reduced chamber at an atmospheric air pressure and then supplied to a processing chamber. The back side of vacuum processing apparatus 100 is a vacuum-side block 102. This vacuum-side block 102 is internally equipped with a preselected number of processing units 103 and 104 having processing chambers for processing a workpiece to be processed, e.g., a semiconductor wafer, at low pressures, a transportation unit 105 for transferring the wafer to any one of these processing chambers under application of a low pressure, and a plurality of load/unload lock chambers (referred to hereinafter as lock chambers) 113 and 113' for coupling together the transfer unit 105 and the atmosphere-side block 101. These are the units having their interior spaces being reduced in pressure and are capable of retaining a pressure of a high degree of vacuum, wherein each is provided with equipment capable of attaining the vacuum degree, such as a vacuum pump as an example.

In this embodiment, the atmosphere-side block 101 which is disposed on front side of the vacuum processing apparatus 100 is the part that performs handling tasks including wafer transfer and storage plus positioning at an ambient pressure whereas the vacuum-side block 102 on the back side is the processing block that performs wafer transfer and processing at a low pressure reduced from the ambient pressure and also performs wafer processing in the wafer mount state while causing the pressure to increase or decrease. Additionally, as will be described later, this embodiment is such that a chassis or housing 108 which is disposed at the atmosphere-side block 101 on the front face side of the vacuum processing apparatus 100 is offset in position toward the left side in the horizontal direction when looking at backside of the vacuum processing apparatus 100 from its front face in a similar manner to the processing unit 104.

The atmosphere-side block 101 has its housing 108 which is a box-like vessel or container that is equipped with a wafer transfer robot (not shown) in an inside space thereof, and three wafer cassette tables 109 which are attached to this housing 108 and which contain wafers to be processed or subjected to cleaning treatment. Further, the transfer robot performs a wafer loading or unloading operation between cassettes on these cassette tables 109 and the lock chamber 113, 113' provided on a side face of backface of the housing 108 to be coupled thereto. The atmosphere-side block 101 has a position alignment unit 111 within such housing 108, for performing the position alignment of a wafer being transferred within this positioning unit 111 in a way pursuant to the posture of wafer layout in either the wafer cassette table 109 or the lock chamber 113 or 113'. Furthermore, as will be described later, in the interior of the housing 108 disposed in the atmosphere-side block 101, a coolant supply unit 300 is provided for adjusting the supply of a cooling liquid, such as water or else, to be used for adjustment of temperatures of vacuum vessels and workpiece tables mounting and holding wafers thereon in the processing units 103a-103c and 104, wherein the coolant to be fed to the vacuum processing apparatus 100 is introduced from another part.

The housing 108 that is disposed in the atmosphere-side block 101 is such that a sideface of its front sideface indicated by arrow in the drawing faces a passage way, along which a wafer-containing cassette is transferred. On the sideface of the front face parallel to this transfer passage, the plurality of (three, in this example) cassette tables 109 are laid out in parallel in a lateral direction in such a manner that their upper faces on which the cassette is to be mounted are at the same height. When the wafer-containing cassette is placed on the cassette table 109, the wafer is transferred within an inner space of the housing 108 at ambient pressures between the cassette inside and the lock chamber 113 or 113' of transfer unit 105. In other words, this housing 108 is an ambient pressure transfer vessel, which is driven by its associative robot which moves on a parallel axis of the front face-side sideface within the internal ambient pressure transfer chamber so that the wafer is transported between the cassette and the lock chamber 113, 113'. In short, the housing 108 becomes an ambient pressure vessel, within which the wafer is transferred under application of an ambient pressure.

The processing units 103a-103c and 104 which are included in the vacuum-side block 102 in this embodiment are such that the processing units 103a-c are etching-processing units each having an etching chamber for performing etching of a wafer to be transferred from the cassette table 109 to vacuum-side block 102. On the other hand, the processing unit 104 is an ashing-processing unit for performing ashing treatment of a mask and unnecessary materials on a surface of the wafer that was applied the etching in the processing units 103a-c.

Any one of these processing units is such that its upper part is a processing vessel unit which has a vacuum vessel that internally has a processing chamber for performing processing of each wafer, wherein it has a plasma generating means including an electric-field/magnetic-field generation means disposed thereover, beneath which a vacuum pump for evacuation of the interior of the processing chamber is disposed and connected to the vacuum chamber while having below the vacuum pump a rectangular solid shape or its resembling shape, which becomes a bed structure for receiving therein power supply and control devices as required for an operation of the vacuum pump or the processing vessel unit. The processing units 103a-c and 104 in this embodiment are arranged so that side walls of vacuum vessels of these upper processing vessel units are detachably coupled to a vacuum vessel sidewall of polygonal planar shape so that their interior spaces are communicably connected together. Attaching/detaching of processing unit is performed in its entirety, and the bed structure has a connector module for performing connection/separation of the device or devices received therein.

The transfer unit 105 constituting the vacuum-side block 102 has a vacuum vessel to which these processing units are detachably attached and which has its interior that is evacuated to a high degree of vacuum and maintained thereat. This vacuum vessel is a vacuum transfer container which has therein a transfer chamber 112 having its interior in which is conveyed either a wafer to be processed in the above-noted processing unit(s) or the wafer that was subjected to the processing.

Briefly, the transfer unit 105 is constituted from the processing units 103a-103c and 104, the transfer chamber 112 which is pressure-reduced in its interior and in which the robot arm (not shown) that conveys an unprocessed or processing-completed wafer between each processing unit and the lock chamber 113 is disposed at a location in close proximity to the center of this chamber, and the above-stated plurality of lock chambers 113 and 113'. The robot arm that is disposed within the transfer chamber 112 for wafer transportation and four mutually coupled processing units that are disposed around the transfer chamber 112 are placed within two lock chambers 113 and 113' and laid out in an axial symmetrical fashion in such a manner that the center of rotation is located at an almost equal distance from the mount surface of workpiece table, on which the wafer is mounted. The lock chamber 113, 113' is an inner space of vacuum vessel for variable adjustment of an internal pressure between the ambient pressure and the pressure of a prespecified vacuum degree which is equivalent to that within the transfer chamber 112, and has the function of communicating with inside of the atmosphere-side block 101 in the state that it is set at the ambient pressure whereby the robot arm of the transfer chamber 112 becomes the means for transferring a workpiece to and from the atmosphere-side block 101.

As previously stated, the lock chamber 113, 113' is disposed between the atmosphere-side block 101 and the transfer chamber 112 that constitutes the transfer unit 105 for coupling together to thereby carry a wafer therebetween. The lock chambers 113, 113' is such that after installation of the wafer which was transferred while being mounted on the robot arm (not shown) which is disposed within the transfer chamber 112 in the interior of the vacuum transfer vessel with its interior being lowered in pressure, its internal pressure is increased up to the ambient pressure and then the wafer is mounted on another robot arm (not shown) that is disposed within the atmosphere-side block 101 for unloading it to the atmosphere-side block 101 side. This unloaded wafer is then returned to either its original position or any one of these cassettes. Alternatively, the wafer that was taken out by the robot arm from any one of these cassette tables 109 is situated within the lock chamber 113 or 113' being set to an outside air pressure and, thereafter, mounted on the robot arm within the transfer chamber 112 with its inside being similarly pressure-reduced and then transferred through inside of the transfer chamber 112 toward any one of the processing units 103a-c and 104.

To perform the above-stated operation, a gas feed device and a gas exhaust device are connected to the lock chamber 113 or 113', for coupling together the atmosphere-side block 101 and the transfer chamber of transfer unit and for increasing or reducing the internal pressure and retaining this pressure in the state that the to-be-transferred wafer is internally mounted thereon. To do this, gate valves (not shown) are disposed at front and back sides of this lock chamber 113, 113' for performing an opening or closing operation to thereby seal its interior space. The lock chamber 113, 113' further includes therein a base or pedestal on which the wafer is mounted to thereby achieve a means for rigidly holding the wafer to ensure that it does not move when the internal pressure is increased or decreased. In short, these lock chambers 113 and 113' are arranged so that each has the means for sealing its interior while standing up against a difference between internal and external pressures to be formed, in the state that the wafer is stably mounted inside of it.

While in this embodiment the processing units 103a-c and 104 are arranged by three separate etching-processing units and one ashing unit, these units are designed so that respective vacuum vessels are detachably coupled to respective side-faces of the transfer chamber 112 of the transfer unit 105. The vacuum vessel that constitutes the transfer chamber 112 has its planar shape like a pentagon or hexagon, wherein a side-face which forms right and left edges when looking at from the front face side of lower part of the vacuum processing apparatus 100 in the drawing becomes a surface perpendicular to a symmetrical floor which is in parallel, at an equal distance, to the axis of the vacuum processing apparatus 100 in an anteroposterior direction, which axis passes through the center within the transfer chamber 112 in the up-down direction in the drawing. In addition, two sidefaces that are rear-side edges at upper part in the drawing become vertical surfaces which are symmetrically disposed while having a predetermined angle relative to the axis in the anteroposterior direction.

The transfer chamber 112 is arranged so that the three etching-processing units 103a-103c are detachably coupled to symmetrical sidefaces corresponding to two sides on the far side of the transfer chamber 112 and right-edge side when viewing from the upper face whereas the ashing-processing unit 104 is connected to left-side sideface, with the lock chambers 113 and 113' being coupled to the remaining sides of the transfer chamber 112. To make a long story short, in this embodiment, the three etching chamber 103a-c and one ashing chamber 104 are radially laid out around the planarly polygon-shaped transfer chamber 112 with respect to the sides thereof.

Additionally in this embodiment, the processing units 103a-c and 104 that are coupled to the transfer unit 105 are movable in the horizontal direction with respect to this transfer unit 105 and are detachably arranged; simultaneously, in the transfer unit 105, the lock chamber 113, 113' and the transfer chamber 112 are detachably arranged so that each is coupled thereto while having movability in the horizontal direction. Further, each of the processing units 103a-c becomes the unit that has the same shape or the same layout of its attached equipments with respect to the periphery of an axis penetrating the center of the above-noted planar shape of the transfer chamber 112 in the state that it is communicably coupled to the transfer unit 105 and attached to the main body of vacuum processing apparatus 100. Furthermore, each of the processing units 103a-c has its vacuum vessel and workpiece table or base structure as disposed within the processing chamber provided within this vessel for causing a wafer to be mounted thereon, which are laid out in such a manner as to equalize a distance between its center and the axis in the up-down direction (perpendicular to the floor face) penetrating the center of rotation of the robot that is disposed within the transfer chamber 112 for transferring the wafer while rotating: around this axis, the processing units 103a-c are laid out to have the same arrangement. In short, there are made identical the coupling part with the transfer unit 105 relative to the center of rotation of the robot of each processing unit, processing chamber, workpiece support table, electric/magnetic-field supply means, gas feed port to inside of processing chamber, gas exhaust port of processing chamber, shape of bed unit, structure and position.

The ashing-processing unit 104 also is disposed while having its vacuum vessel, processing chamber and workpiece table in a similar way to that stated supra. In the state that this is coupled to the transfer unit 105, a distance between the workpiece table's mount surface and the center becomes equal to the distance with respect to the processing units 103a-c. Note here that the processing unit 104 is the unit in which the wafer that was applied processing by the processing units 103a-c is subjected to its following processing: after completion of the etching of specifically shaped groove and/or hole shapes of a wafer surface, processing is performed, such as ashing of a resist mask for defining such shapes and removal of components of a gas of high corrosivity as has been used for the etching.

A typical example of the wafer processing to be performed in this type of apparatus is as follows. A wafer is taken out of inside of a cassette which is mounted on the cassette table 109 that was transferred by a prespecified transfer means (not depicted) along a passage that is placed in front of the housing 108 of the atmosphere-side block 101 into hands of the robot arm which is disposed within the housing 108 and is then conveyed in the ambient pressure transfer chamber within the housing 108 for loading into the lock chamber 113 or 113' that is set at an ambient pressure and next mounted on the workpiece table. Thereafter, the sealed lock chamber 113 (113') is pressure-reduced to create therein an internal pressure which is substantially the same as that of the transfer chamber 112; then, the wafer is taken out by the robot within the lock chamber 112 and transferred toward an appropriate one of the etching-processing units 103a-c for receiving etching therein; next, it is conveyed in the pressure-reduced transfer chamber 112 toward the processing unit 104 again for execution of ashing treatment applied thereto. Thereafter, the wafer is carried by the robot within the transfer chamber 112 from the transfer chamber 112 into the pressure-reduced lock chamber 113 (or 113') and then unloaded to enter the atmosphere-side block 101 and next returned by the robot within the housing 108 to its original position within the cassette on the original cassette table 109.

Figure 2A:
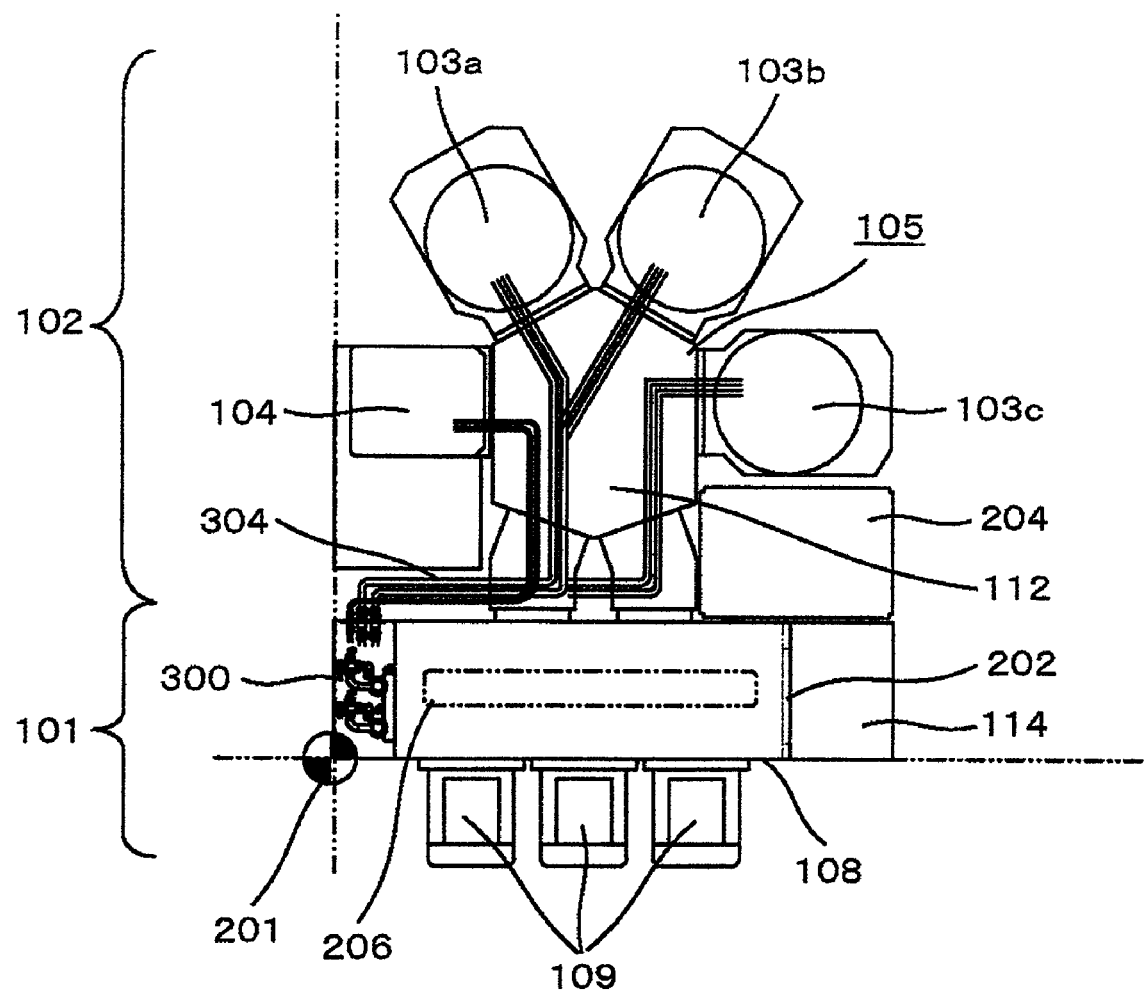
FIG. 2A is an upper plan view of the vacuum processing apparatus shown in FIGS. 1A-1B.
Figure 2B:
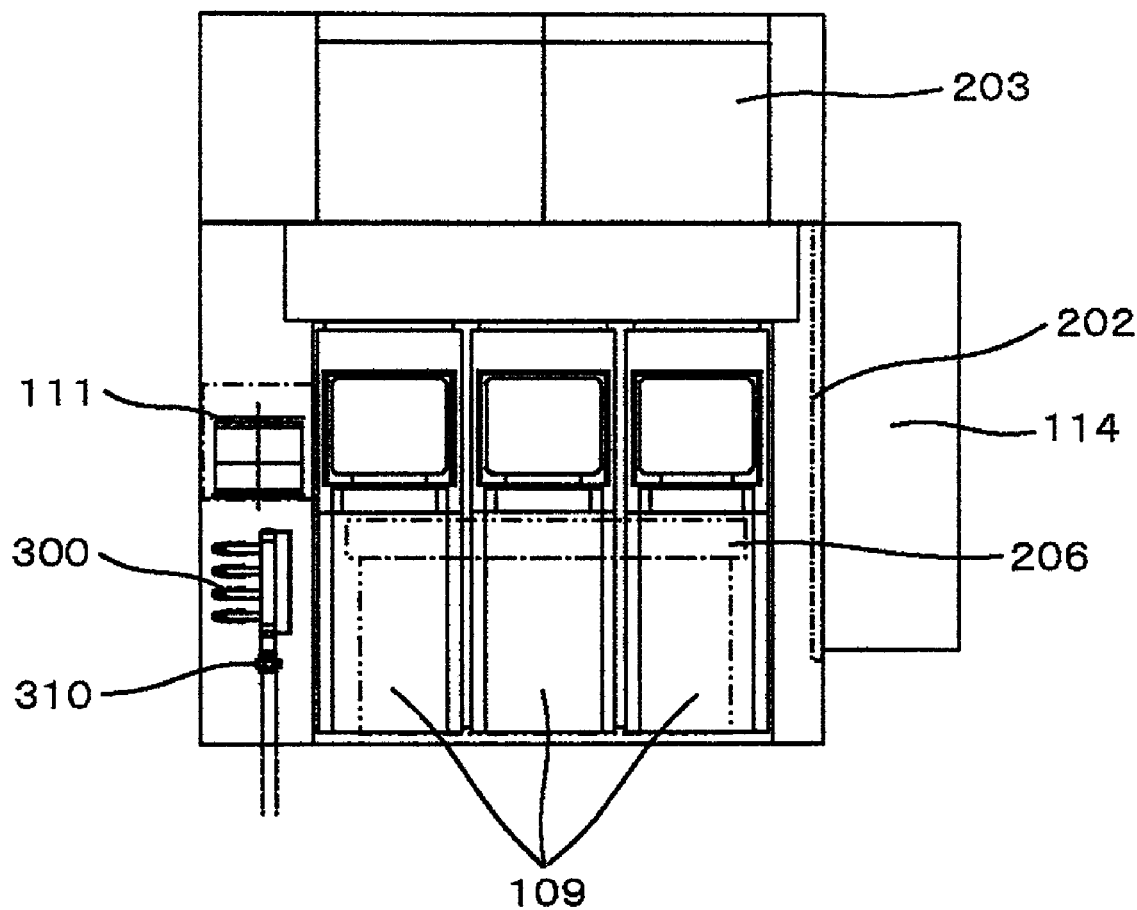
FIG. 2B is a front view of this apparatus.

FIGS. 2A and 2B are diagrams showing a layout of the coolant supply unit 300 and its cooling medium circulation route, wherein FIG. 2A is an upper plan view of the vacuum processing apparatus 100, and FIG. 2B is a front view of it. As previously stated, the atmosphere-side block 101 has its housing 108, in which the position alignment unit 111 and coolant supply unit 300 are disposed.

Usually, several utilities necessary for the processing and operation of the vacuum processing apparatus 100, such as a temperature adjuster of a coolant of the workpiece table and a device for circulation and supply of a thermal conduction-facilitating gas, are typically provided at another location—for example, on another floor beneath the floor of a semiconductor device fabrication line-constituting building of a factory in which the apparatus is installed—for supplying/collecting and circulating the coolant while locating a chiller unit for adjusting a temperature of such coolant with the aid of a pipe path being additionally provided to each apparatus main body for feeding and collecting the coolant. This is in order to minimize the layout interval of adjacent ones of a plurality of vacuum processing apparatuses 100 to be laterally arrayed along the cassette transfer passage in front of the atmosphere-side block 101, thereby to dispose a maximal number of apparatuses by utilizing more effectively the area of the factory fabrication line in the factory.

For example, the coolant or refrigerant (this is a liquid which contains industrial water as its main component in this embodiment) is supplied, for internal circulation, to its associated pipe path by the chiller unit that is disposed on another floor in this way. The pipe path is projected to be introduced into upper part of a floor face by an opening which is defined in the floor face on which the apparatuses are installed and is connected to a connector unit 310 which is disposed at lower part of the coolant supply unit 300 that is disposed above the opening and coupled to the vacuum processing apparatus 100. The water that is the coolant as fed from the pipe path flows into the coolant supply unit 300 by way of the connector unit 310 and flows out of it after divarication therein for use in the four processing units 103a-c and 104 of this embodiment. Respective divaricated or branched pipe paths are coupled together to a connector unit 303, which is disposed at a lower left portion on the housing 108's backface in the interior of this housing 108 for supply to respective ones of the processing chambers through coolant feed/exhaust pipes 304 which are coupled at the outer side of it.

The cooling water that is fed to each processing chamber is used to cool the workpiece table down to a prespecified temperature during execution of processing in each processing chamber and, thereafter, returned to the coolant supply unit 300 via the coolant feed/exhaust pipe 304 and the connector unit 303. The flows of water which are exhausted from respective processing units are combined together within the coolant supply unit 300 and then caused to circulate in such a way as to return to the chiller unit beneath the floor from the pipe path through the connector unit 310 that is provided beneath the coolant supply unit 300.

Within the housing, a transfer robot (not shown) is disposed. By an operation of this robot, wafer transfer within the housing 108 is performed. This robot has more than one arm with a hand for mounting a wafer thereon, for moving toward the right or left side on a rail 206, which extends in right-left direction (lateral direction in the drawing), along this rail in the horizontal direction when viewing from the apparatus front side in the transferring space within the housing 108 while simultaneously changing its height position in the up-down direction when the need arises to thereby convey a wafer between the plurality of cassette tables 109 in front of the housing 108 and the lock chamber 113, 113' on the rear side.

This wafer transportation within the housing 108 is performed in the flow of a gas which contains air or a corrosive gas approaching from upper to lower part in the transfer-use interior space of the housing 108. In order to form such the downward gas flow, more than one fan is provided at upper part of the housing 108 of this embodiment and, below it, an opening which is communicably coupled to outside of the housing 108 is disposed to thereby generate by an operation of this fan the downflow directing from upper to lower part with respect to an entirety of the transfer-use interior space. On the other hand, the housing 108 has its wafer position alignment unit 111 for causing the position of a wafer as taken out of the cassette to stay within a predetermined range. This wafer position alignment unit 111 adjusts both the center of such untreated wafer being mounted on a rotating cylinder-shaped pedestal and the position of a cutaway portion that is preformed in the wafer so that these become predefined ones relative to the hand(s) of the robot.

The position alignment unit 111 that handles such the prior-to-processing wafer is disposed at one end side of the housing 108 when looking at from its the front side—in this embodiment, at a left-side portion—as shown in FIG. 2A by taking into consideration an operation of the robot and the downward flow. Its height position is laid out so that the lower end portion becomes adjacent to the upper face of the cassette table 109. With this layout, it is possible to achieve reduction of a moving amount of the robot and suppression of unwanted wafer contamination.

Further, an auxiliary or "spare" port 202 is disposed on a sideface on the opposite end side (right side in the drawing) of the housing 108. This spare port 202 has an openable/closable opening and is detachably arranged by letting a component that is different in accordance with the user's request be an additional unit. For example, another cassette table 114 may be put in position so that this is coupled to the spare port 202. This spare port 202 includes a load port which is driven to open and close when the cassette table 114 is disposed for facilitating and blocking the interconnection between inside of the cassette and the ambient pressure transfer room interior of the housing 108. Additionally installable in the spare port 202 are a refuge or "rest" station having a vessel capable of storing a plurality of (e.g., the same number as that of those wafers received in a cassette) wafers prior to execution of the processing in the vacuum-side block 102 or after completion of such processing and an inspection device for optically checking for defects an unprocessed or processing-finished wafer. The spare port 202 has size dimensions and layout adaptable for use with respective devices for these different purposes, and the opening is arranged to be openable and closable to thereby shut off the interior of the housing 108 from its outer atmosphere.

In this embodiment, a front sideface of the housing 108 faces the cassette transportation passage and is disposed in parallel with this transfer direction. And, on the front sideface of the housing 108, three cassette tables 109 are laid out along the transfer direction. Typically mounted on each of these cassette tables 109 is a cassette which stores therein at least one lot having a plurality of product-use wafers to be used in the manufacture of products, such as semiconductor device or else. Although three cassette tables 109 are employed in this embodiment, these are replaceable by the layout of a single table, for example.

A footplate 204 is disposed on a floor surface between the backface of the housing 108 of the atmosphere-side block 101 and a front end of the processing unit 103a. A plurality of devices and instruments which are needed for the operation of the vacuum processing apparatus 100 are disposed above a floor face which is beneath the transfer chamber 112 of transfer unit 105, and a part below the transfer chamber 112 becomes a space for receiving these devices and instruments. Additionally, in view of the fact that a working space is also necessary when the user uses these devices and instruments to perform maintenance works, such as repair, inspection, parts replacement, etc., a predefined distance is kept between upper ends of the devices and equipments installed on the floor face and a lower surface of the vacuum vessel of polygonal planar shape, which constitutes the transfer chamber 112.

Further, in this embodiment, more than one flat plate is disposed to overlie and cover the devices and instruments on the floor face beneath the transfer chamber 112 and has its planar shape which is formed into a polygon below the transfer chamber 112 in such a manner as to match the shape of the vacuum vessel of the polygonal transfer chamber 112. This flat plate becomes a footboard having its strength large enough to enable a worker to ride thereon while forming beneath the transfer chamber 112 a maintenance-use space with a flat lower surface. Further, this footboard has an upper surface having a height which is identical to the height of the upper flat surface of the rectangular solid-like bed structure of each of the processing units 103a-c and 104.

Note here that the footplate 114 which is disposed on the floor face between the etch-processing unit 103c and the housing 108 has a space below the flat plate constituting the upper flat surface between a plurality of support poles or pillars that support this flat plate, in which space is situated a distributor (not shown) of a gas or gases to be fed to each processing unit. This gas distributor is operatively coupled with a plurality of pipes which are gas-flowably connected to a plurality of kinds of gas sources that are disposed on another floor beneath the floor on which the vacuum processing apparatus 100 is installed. A gas supplied is guided to flow from this distributor to the processing units through a pipe/tube path which is branched in units of processing units. The branched gas pipe path is also disposed along with the cooling water supply/exhaust pipe 304 in the space beneath not only the footplate 114 but also the footplate constituting the flat surface below the transfer chamber 112 for coupling with each processing unit.

In other words, the lower part of the vacuum-side block 102 becomes a block having flat surfaces which are constituted from the height-identical footplate and the bed structure, wherein each of these flat surfaces is designed to enable the user to ride thereon for maintenance works and, at the same time, becomes a storage space beneath the flat plate constituting the flat surface. Between adjacent ones of the processing units also, a footplate which is the same in height as the person-riding face of the storage block and which permits the worker to ride thereon to perform his or her expected works may also be disposed detachably, thereby making it possible to make easier the maintenance work for each processing unit.

The housing 108 of this embodiment is such that a control unit 203 is disposed therein at its inner upper part, for controlling operations of the wafer transfer robot and respective processing units plus the downflow-forming fan. Further, at rear part within the housing 108, a duct 205 is disposed, which receives electrical wires for electrically connecting together the processing units and the transfer robot plus the control unit 203. Although this duct 205 is positionally offset within the housing 108 toward its left end side by taking account of wafer transportation and thus laid out in close proximity to either the wafer position alignment unit 111 or the coolant supply unit 300, this duct is arranged to be placed on the right side of them while causing a plate-like member with its square bracket-shaped cross-section to be attached to inside of the housing 108's backface.

When the vacuum processing apparatus 100 shown in this embodiment is installed within the user's building, such as a cleanroom, it is a general approach to install the atmosphere-side block 101 first. The reason of this is as follows. In the case of installing the vacuum processing apparatus 100 in the building, it is a must to install the cassette tables being disposed in front of the apparatus in such a manner as to face the transfer passage as stated supra; so, the atmosphere-side block 101 and housing 108 facing the cassette transfer-use passage are installed first, followed by sequential installation of the vacuum-side block 102 on the rear side after having installed the atmosphere-side block 101. Works are performed by setting up a specific position that becomes the reference of the installation at this time; in this embodiment, the reference position is such that the installation within the user's building is done by setting as the reference position 201a position at which a lower left end part of sideface on the front side of the housing 108 is projected onto the floor face on which the vacuum processing apparatus 100 is installed.

Further, in this embodiment, the atmosphere-side block 101 and the housing 108 are laid out so that these are offset in position toward the left side of the vacuum processing apparatus 100 when looking at from its front side; in particular, this layout is arranged in such a way that the left end of the vacuum-side block 102 coincides with the left end of the atmosphere-side block 101 or housing 108. In this case, it is convenient that the wafer position alignment unit 111 is disposed on the left end side when viewing it from the front face within the housing 108. This can be said because the position is determined without regard to the number of cassette tables 109 and irrespective of whether an extra unit added to the spare port 202 is present or absent whereby a maintenance-use space of the vacuum processing apparatus 100 is reserved pursuant to each of the number of etching units 103a-c of the vacuum-side block 102 and its layout pattern so that it is possible to suppress movement of the atmosphere-side block 101 and housing 108.

Furthermore, the position alignment unit 111 which is disposed at the left end within the housing 108 is laid out so that the height of its lower end is the same as the height of the upper face of the cassette table 109 on the front side, for example. In this case, a space appears below the wafer position alignment unit 111; so, in this embodiment, the coolant supply unit 300 is disposed in this space to thereby receive it within the housing 108 that constitutes a rectangular solid body. In this way, in the housing 108, the space (dead space) is created beneath the position alignment unit 111 to thereby make it possible to implement effective use of the space (dead space) by disposing the coolant supply unit 300 in this space (dead space), resulting in achievement of footprint reduction. Thus it becomes possible to improve the user's manufacturing efficiency while simultaneously lowering production costs.

Further in this embodiment, the left end of the processing unit 104 when viewing from its front side is identical to the plane perpendicular to the floor face in an anteroposterior direction passing through upper part of the aforesaid reference position 201, resulting in the left end of this processing unit 104 becoming the left end of vacuum-side block 102. It is not always necessary for the plane of the left end of vacuum-side block 102 to exactly match the plane perpendicular to the floor face in the anteroposterior direction passing through the reference position 201 in the way stated above. The reference position 201 (left end of housing 108) may alternatively be set at a location on the right side of the left end of vacuum-side block 102.

Figure 3A:
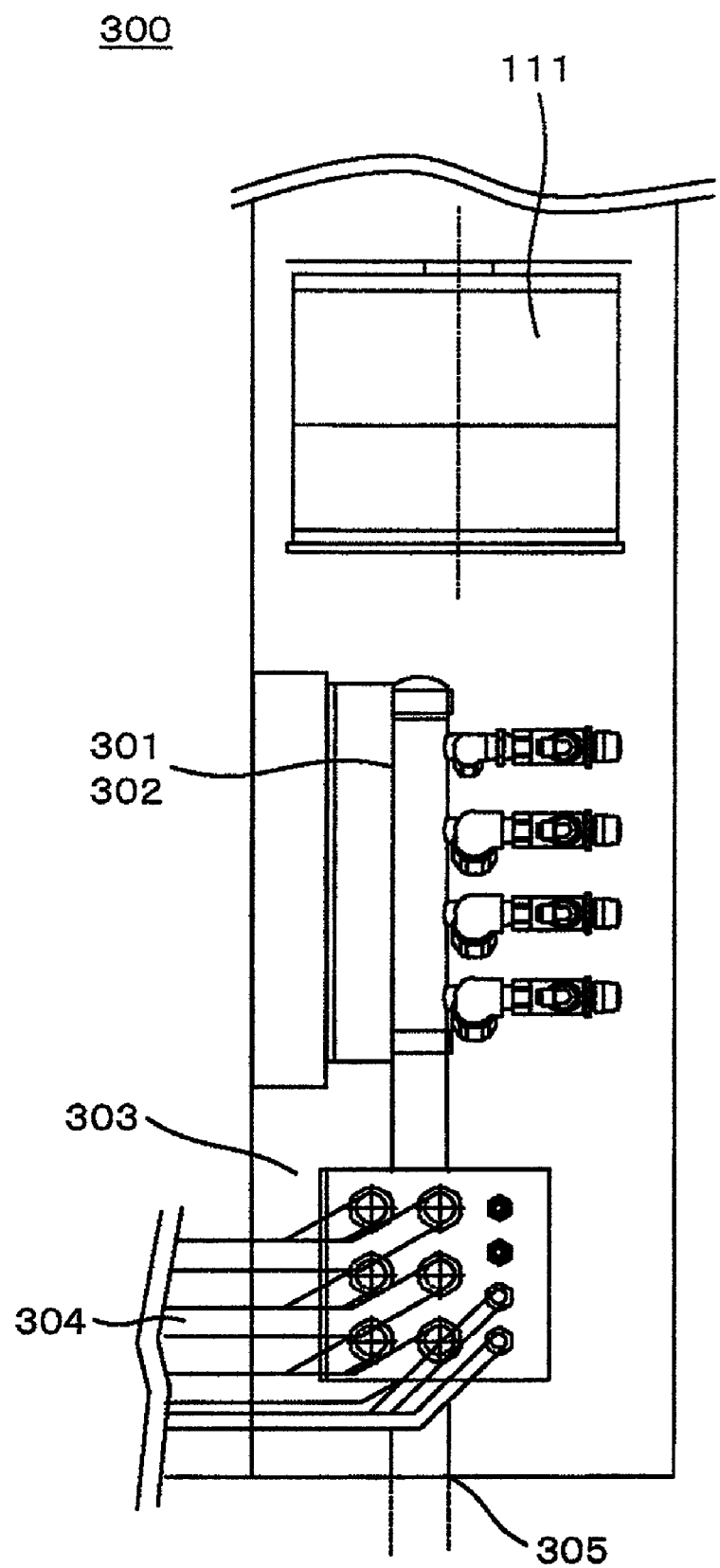
FIGS. 3A-3B are diagrams each showing a rear side view of a coolant supply unit which is provided in the apparatus shown in FIGS. 2A-2B.
Figure 3B:
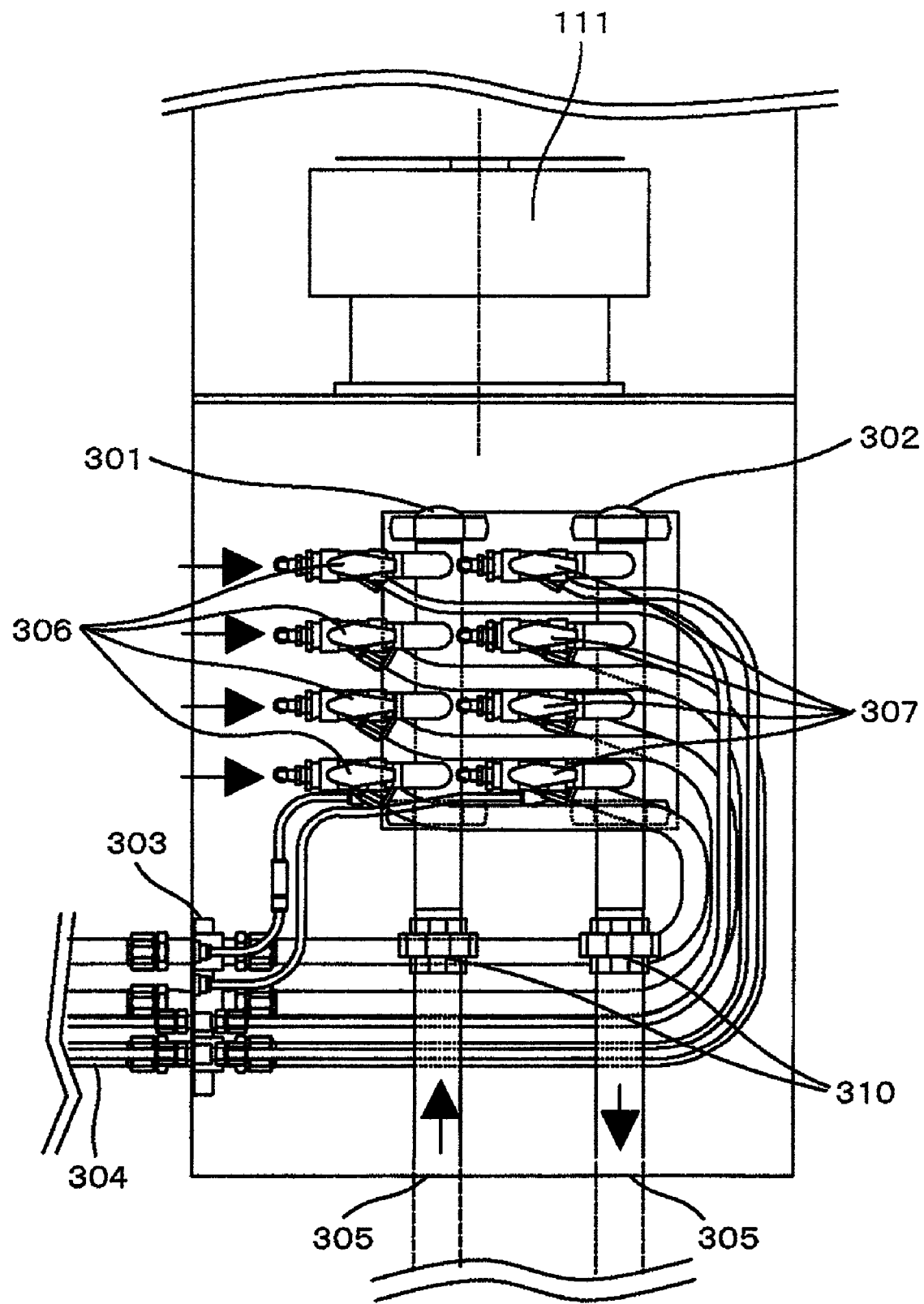

FIGS. 3A and 3B are diagrams each showing a detailed arrangement of the coolant supply unit 300, wherein FIG. 3A is a left side view of the housing 108 whereas FIG. 3B is a rear side view thereof. The coolant supply unit 300 is equipped with a cooling water inlet pile 301 and a cooling water outlet pipe 302, which are disposed in parallel along its up-down direction.

Each of the coolant water inlet pipe 301 and coolant outlet pipe 302 passes through an opening 305 with the aid of the connector unit 310 that is located thereunder and is coupled with a pipe path which penetrates the floor face to extend from lower to upper part. The coolant water inlet pipe 301 is branched in units of respective processing units by four branch pipes which are disposed in parallel at prespecified intervals along the axis of such pipe, resulting in each branch pipe being coupled to an inflow-side pipe path which is connected to each processing unit, thereby forcing the cooling water being fed from the pipe path coupled by the connector unit 310 to the coolant water inlet pipe 301 to be split for flowing into each processing unit. The coolant water outlet pipe 302 is coupled to an outflow-side pipe path connected to each processing unit by four branch pipes, which are disposed in parallel at certain intervals along the axis of the pipe, for causing those flows of cooling water exhausted from respective processing units to be combined together at the coolant water outlet pipe 302 and then drained out of the lower pipe path to a part below the floor face.

Each branch pipe of the coolant water inlet pipe 301 and outlet pipe 302 is provided with a three-way valve. For example, a three-way valve 306 in each branch pipe of the coolant water inlet pipe 301 is the one that operates to switch between the flow of cooling water and the flow of a gas, such as air or a nitrogen gas which is fed from a pipe (not depicted) that is coupled at the left end in FIGS. 3A-3B. A three-way valve 307 in each branch pipe of the coolant water outlet pipe 302 is the one that operates to switch between draining/exhaust of the cooling water to a pipe (not depicted) that is coupled at the left end in the drawing and flowing in the coolant water outlet pipe 302. In this way, the coolant supply unit 300 has the functionality of an adjuster which adjusts the supply of the cooling water.

This embodiment is structured to permit the user to operate these three-way valves 306-307 in units of respective processing units to thereby enable ON/OFF control of the supply of the cooling water. By gathering the user's operated valves together at a one location, the operability of periodical maintenance and emergency relief works is improved. In addition, the openable/closable opening is disposed below the left-side sideface of the housing 108 for enabling the user to manually operate the three-way valve 306, 307 through this opening.

Also importantly, the coolant supply unit 300 is specifically arranged so that the coolant water inlet pipe 301 and coolant outlet pipe 302 are coupled to the sidewall of the housing 108 and thus fixed in position whereby the position of the entire unit, including the branch pipes and the three-way valves 306-307, is fixed relative to the housing 108. Consequently, when the housing 108 is secured in position to the floor face on its top surface, it becomes the structure that causes the position on the floor face of the coolant supply unit 300 and its relative position with respect to the atmosphere-side block 101 to be fixed together. In the state that the vacuum-side block 102 is attached and coupled to the atmosphere-side block 101, a relative position of the coolant supply unit 300 with respect to each processing unit also becomes fixed. With this arrangement, even when a processing unit is attached or detached or a different type of processing unit is newly added to the vacuum processing apparatus on its installation floor face this apparatus supplies a fluid, such as a gas or a cooling water or else, to its processing units—while at the same time lowering a variation of the length of a pipe in which the fluid flows, it is possible to stabilize the performance of the processing unit to thereby suppress an increase in performance difference.

Below the coolant supply unit 300 that is placed within the housing 108, there are disposed the cooling water-use pipe which is coupled to the chiller unit beneath the floor face extending upward after penetration of the opening 305 in the floor face and the connector unit 310 at which respective ones of the coolant inlet pipe 301 and coolant outlet pipe 302 are coupled together. The connector unit 310 is disposed at a predetermined height over the floor face and has elasticity or resiliency extending from the opening 305 of the floor face to thereby provide a degree of freedom for the layout of deformable pipes. In short, in the case where a structural member such as a beam or beams for supporting the floor are located immediately below the coolant supply unit 300 when installing either the vacuum processing apparatus 100 or the atmosphere-side block 101, it is desirable to install the pipes so that these extend not to collide with this structural member. If this is impossible, it becomes necessary to modify again the installation position of atmosphere-side unit, resulting in an increase in quantity of work, which leads to reduction or loss of a maintenance-use space around the apparatus. By locating the connector unit 310 at a specific position which is sufficiently spaced apart from the floor face, it becomes possible to deform the elastic pipes for coupling with the connector unit 310. This makes it possible to place the opening 305 within a projected plane of the housing 108 in the vertical direction. It is also possible to suppress unwanted increase of installation area and improve the work efficiency at the time of installation.

In addition, by disposing the coolant supply unit 300 in the dead space beneath one end of the housing 108, unwanted footprint increase is suppressed to lessen the risk of reduction of the maintenance space, thereby making it possible to improve the efficiency of the user's semiconductor wafer processing while simultaneously reducing manufacturing costs.

According to the embodiment stated above, a waste of the space needed for maintenance works is reduced to thereby lessen the size of a substantial installation-required region or area of the location at which the vacuum processing apparatus 100 is installed, thus making it possible to enlarge the number of apparatuses capable of being installed at a one location, which leads to improvements in efficiency of the intended processing and efficiency of product fabrication thereby. In addition, those works needed for maintenance and parts replacement are reduced to shorten the length of a time period in which the apparatus becomes nonoperational whereby the processing efficiency is improved so that the productivity per installation area is increased.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A vacuum processing apparatus comprising:
a plurality of vacuum processing vessels each having a processing chamber with its interior space being reduced in pressure;
a vacuum pump which is disposed below and connected to said plurality of vacuum processing vessels and which evacuates the interior spaces of said plurality of vacuum processing vessels;
a vacuum transfer vessel being detachably coupled to said plurality of vacuum processing vessels disposed therearound and having a pressure-reduced interior space in which a workpiece to be processed is conveyed, the vacuum transfer vessel being equipped with a vacuum transfer robot which transfers a workpiece disposed inside the pressure-reduced interior space;
an atmospheric air transfer vessel being coupled to a front side of said vacuum transfer vessel and including on its front face side a plurality of cassette tables mounting thereon a cassette with the workpiece being received therein, for causing the workpiece to be conveyed in an interior space at an atmospheric pressure;
an atmospheric-side block which constitutes a front face side of said vacuum processing apparatus and includes said atmospheric air transfer vessel;
a vacuum-side block which constitutes a back side of said vacuum processing apparatus and includes said plurality of vacuum processing vessels and said vacuum transfer vessel;
an atmospheric transfer robot which is disposed inside the interior space at the atmospheric pressure of said atmospheric air transfer vessel and which transfers the workpiece therein, said atmospheric transfer robot being movable along a rail which is disposed inside the interior space and which extends in a horizontal direction to enable transfer of the workpiece therein;
a position aligning machine which is coupled to the interior space of said atmospheric air transfer vessel at one end side position of right and left ends of the rail and which adjusts a position of a center or a cutaway portion of the workpiece around the center, the position aligning machine including a table which rotates around a center while locating the workpiece thereon; and
an adjuster which is disposed on a supply line of fluid from a lower level of a floor face where the vacuum processing apparatus is installed and which adjusts a supply of the fluid as fed to said plurality of vacuum processing vessels, said adjuster being disposed in a projected area of said position aligning machine and between a lower part of said position aligning machine and the floor face.

2. The vacuum processing apparatus according to claim 1, wherein the fluid is a cooling liquid for any one of said plurality of vacuum processing vessels and for workpiece tables as internally provided in said plurality of vacuum processing vessels.

3. The vacuum processing apparatus according to claim 1, wherein said vacuum transfer vessel has a polygonal planar shape when viewing from above said vacuum transfer vessel with said plurality of vacuum processing vessels being coupled to a plurality of sides thereof, wherein said position aligning machine is located at an end portion of said atmospheric air transfer vessel when said atmospheric air transfer vessel is viewed from a front side of said vacuum processing apparatus, and said atmospheric air transfer vessel further including a fan which generates a downflow of air inside the interior space of said atmospheric air transfer vessel and a control unit which controls a movement of said atmospheric transfer robot, said position aligning machine being disposed inside said atmospheric air transfer vessel, and said adjuster being disposed inside said atmospheric air transfer vessel said position aligning machine.

4. The vacuum processing apparatus according to claim 1, wherein said position aligning machine and said adjuster are disposed within said atmospheric air transfer vessel.

* * * * *